United States Patent [19]

Knutson et al.

[11] 4,001,711
[45] Jan. 4, 1977

[54] RADIO FREQUENCY POWER AMPLIFIER CONSTRUCTED AS HYBRID MICROELECTRONIC UNIT

[75] Inventors: William J. Knutson, Tamarac; Daniel M. Smith, Coral Springs, both of Fla.

[73] Assignee: Motorola, Inc., Schaumburg, Ill.

[22] Filed: Aug. 5, 1974

[21] Appl. No.: 492,306

[52] U.S. Cl. .................. 330/66; 330/31; 330/38 M; 317/100
[51] Int. Cl.² .......................... H03F 1/00
[58] Field of Search ............ 330/38 M, 31, 66; 317/100

[56] References Cited

UNITED STATES PATENTS

| | | | |
|---|---|---|---|
| 3,258,606 | 6/1966 | Meadows | 330/38 M |
| 3,502,997 | 3/1970 | Nerud et al. | 330/38 M |
| 3,564,442 | 2/1971 | Germann | 330/38 M |
| 3,568,082 | 3/1971 | Fjallbrant | 330/31 |
| 3,586,917 | 6/1971 | Oates | 317/100 |
| 3,694,699 | 9/1972 | Snyder et al. | 317/100 |
| 3,845,403 | 10/1974 | Heckman, Jr. | 330/31 |

*Primary Examiner*—Palmer C. Demeo
*Assistant Examiner*—Darwin R. Hostetter
*Attorney, Agent, or Firm*—Donald B. Southard; James W. Gillman

[57] ABSTRACT

A radio frequency power amplifier includes a flat ceramic substrate having a conductive coating on one side and a plurality of conductors on the other side arranged in a predetermined pattern. At least one conductor is connected through the substrate to the conductive coating which is grounded. A plurality of components are connected to the conductors on the substrate including a transistor die, chip capacitors, air wound coils, a chip inductor and resistors. Conductors on the substrate are of a configuration to provide spiral inductors, some of which are connected in series with the air wound coils, which have tuning segments adapted to be severed to control the inductance after assembly of the components. Conducting bridges are also provided to join conductors which are spaced from, and insulated from, an intermediate conductor. The substrate is provided in an electrical and heat conducting housing having a base to which the conducting coating is electrically and mechanically secured, and three conducting side walls about the substrate. The fourth side includes terminals connected to a plurality of conductors for applying input signals and operating potential to the amplifier, and for deriving output signals therefrom. A conducting plate closes the top of the housing to completely enclose and shield the substrate and components thereon.

12 Claims, 5 Drawing Figures

RADIO FREQUENCY POWER AMPLIFIER CONSTRUCTED AS HYBRID MICROELECTRONIC UNIT

BACKGROUND OF THE INVENTION

Portable radio transmitters have been provided which are adapted to be held in the hand of the user. Radio transmitters which have been available have had limited power and have been objectionably large. In prior units, microstrip transmission lines have been used for impedance matching elements, but in the very high frequency range such transmission lines are objectionably large and have low efficiency. For operation at relatively high power levels, the microstrip transmission lines have objectionably high insertion loss and if there is some unbalance of the lines, the loss significantly increases. Also, it has been difficult to tune the prior circuits after assembly of the components thereon.

Although RF amplifier stages have been provided as modules, it has been necessary to mount such modules to a chassis in a manner which provides an adequate ground for the circuit and heat sinking for the active elements thereof. A further problem results in providing the power amplifier in a conducting enclosure as the inductance and Q of the coils will be significantly altered by the enclosure, and the coupling between the coils may provide objectionable interaction.

SUMMARY OF THE INVENTION

It is an object of the present invention to provide a small and efficient radio frequency, power amplifier stage.

Another object of the invention is to provide a power amplifier stage which is self-contained and includes a ceramic substrate with conductors and components thereon, and a conducting enclosing housing which forms a ground and shield for the components and which also serve as a heat sink for the active element.

A further object of the invention is to provide a radio frequency power amplifier as a plug-in module which forms its own heat sink and which is adequately grounded.

A still further object of the invention is to provide a small RF power amplifier having components provided on a ceramic substrate and connected to conductors thereon by a reflow soldering process which requires no hand soldering.

Still another object of the invention is to provide a radio frequency amplifier with tuned input and output circuits which can be adjusted for precise tuning after assembly of the unit without reheating the substrate, and which requires no further tuning when installed in the device in which it is used.

The radio frequency power amplifier of the invention is a self-contained hybrid microelectronic unit including a flat ceramic substrate with conductors and components thereon, and enclosed by a conducting housing which forms a grounded shield and which serves as a heat sink. The substrate is a flat rectangular ceramic plate with a continuous conductive coating on one side which is supported on and connected to the base of the housing. A plurality of conductors are formed on the opposite side of the ceramic substrate which are shaped and arranged to form a predetermined pattern. One of these conductors is connected through openings in the substrate to the continuous conductive coating to provide ground connections for the components on the substrate. The components include a transistor die having its collector electrode directly connected to a conductor on the substrate. A plurality of inductors are formed by the conductors, which have tuning segments which can be severed to control the inductance after assembly of the components on the substrate. A plurality of chip capacitors are connected between the conductors, and air wound coils, a chip inductor and resistors are also connected between the conductors. Conducting strips form bridges for joining conductors which are separated by intervening conductors on the substrate. The housing includes one conducting member forming the base and three side walls, with provisions for receiving a fourth insulating wall in which terminals are mounted. A conducting plate closes the top of the housing to provide a complete enclosure about the substrate and components thereon. The self-contained unit forms a plug-in module with recesses formed in the housing to receive grounding pins and/or clips, and with pins extending from the ceramic substrate to make connections to the amplifier.

DETAILED DESCRIPTION

Figure 1:
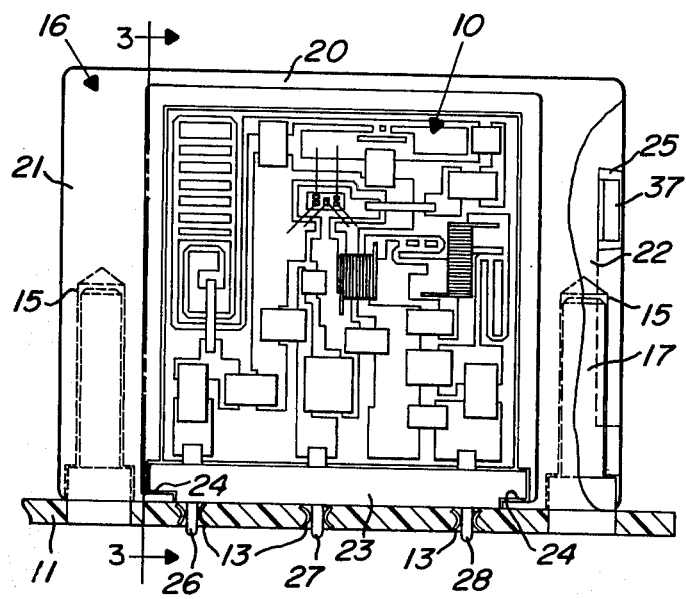
FIG. 1 is a top view of the radio frequency power amplifier unit with the top cover removed showing the components on the substrate.
Figure 2:
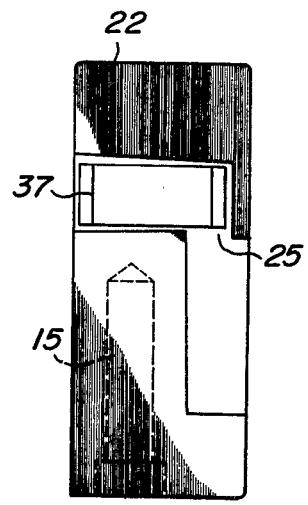
FIG. 2 is an end view of the housing of the unit.
Figure 3:
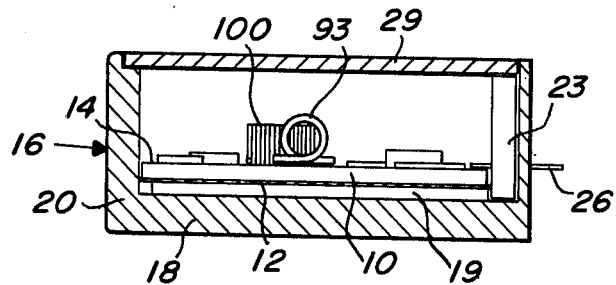
FIG. 3 is a cross-sectional view of the amplifier unit of FIG. 1 along the lines 3—3.
Figure 5:
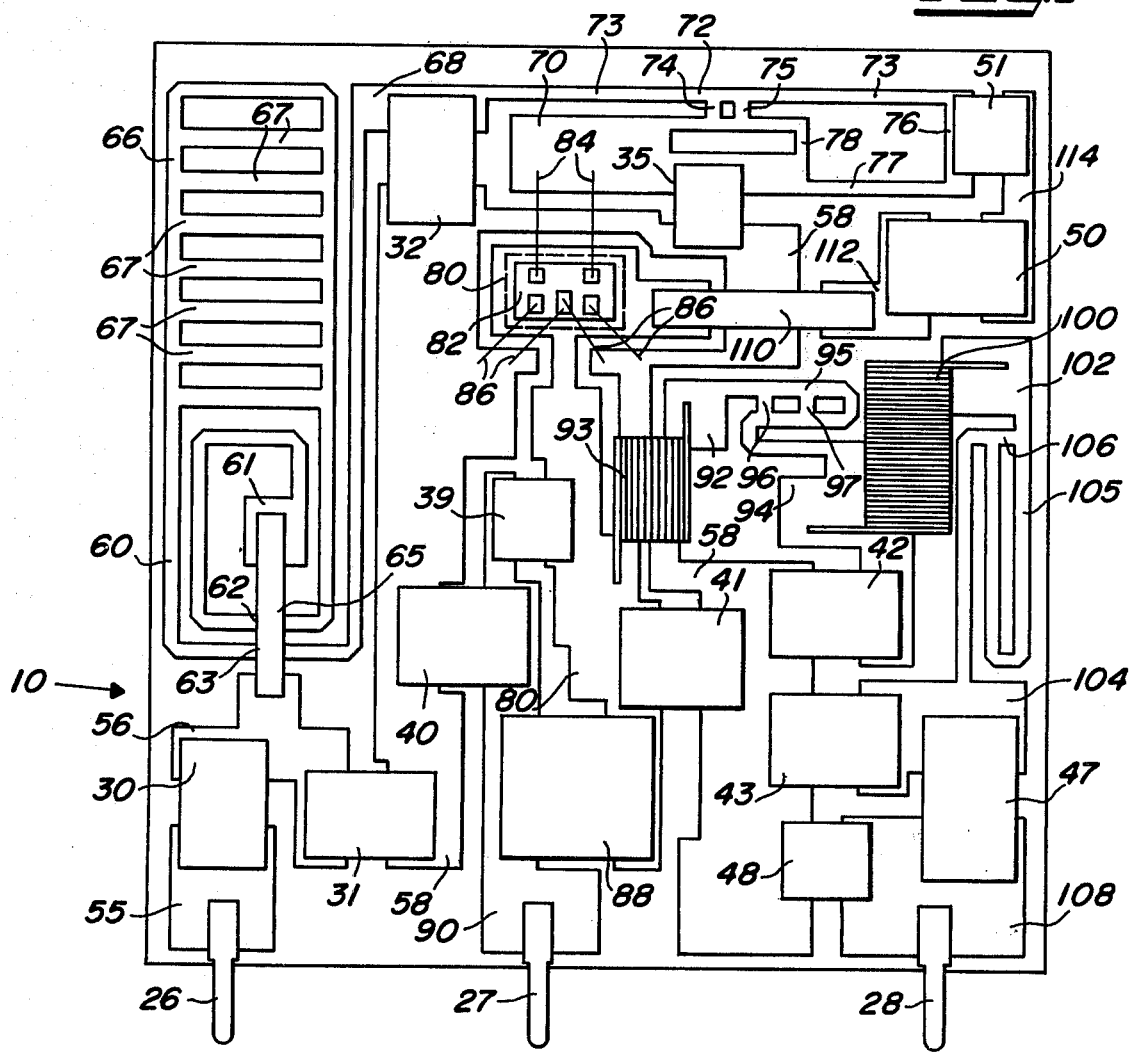
FIG. 5 is an enlarged view showing the conducting pattern on the ceramic substrate, and the connection of the components thereto.

FIGS. 1, 2 and 3 illustrate the construction of the radio frequency power amplifier of the invention. This includes a ceramic substrate 10, which is a flat plate of rectangular configuration. The ceramic plate 10 has a conducting coating 12 completely covering the bottom side (FIG. 3) and conducting portions 14 on the top side. The shape and arrangement of the conducting portions is shown in FIG. 5. Electronic components are supported on the top surface of the plate 12 and connected to the conductors 14 thereon. The particular components and the connections thereof will be described in detail hereafter.

The power amplifier unit is enclosed in a conducting housing 16 which has a base 18 with a raised central portion 19 which supports the ceramic substrate 10, and is electrically connected to the conducting coating 12 on the bottom side of the substrate 10. The housing has a back wall 20 and side walls 21 and 22 which have substantial thickness. The housing base and walls have substantial mass and form an effective heat sink for the transistor provided on the substrate, and any other component thereon which develops substantial heat. At the side opposite the wall 20 is an insulating closure 23, through which terminals 26, 27 and 28 extend. The closure 23 fits into slots 24 at the front ends of the side walls 21 and 22 to hold the same in place. The terminals 26, 27 and 28 are connected to conductors 14 on the top side of the substrate 10. To complete the enclosure for the unit, a top plate 29 made of conducting material is positioned in a recess about the top of the walls 20, 21 and 22. The plate 29 is soldered in place and extends across the top of the closure 23 to hold the same in place.

The power amplifier unit forms a hybrid microelectronic plug-in module which can be supported on a chassis 11, as shown by FIG. 1. The chassis 11 may have sockets 13 thereon for receiving the conducting pins 26, 27 and 28, to make electrical connections to the amplifier circuit. The side walls 21 and 22 of the housing 16 have openings 15 therein to receive conducting pins 17 secured to the chassis 11 for making grounding connections thereto. These pins may also provide heat conduction to the chassis, although the housing itself provides heat conduction for the power amplifier. As shown in FIGS. 1 and 2, the wall 22 of the housing has a recess 25 on the outer side which can receive a conducting clip 37 to provide good electrical connection between the power amplifier unit or module and an adjacent module in the equipment in which the amplifier is used.

As will be apparent in FIG. 1, the ground connecting pins 17 which extend from the chassis 11 into the recesses 15 in the housing 16 are longer than the conducting pins 26, 27 and 28 which extend from the unit. Accordingly, when the module is positioned on the chassis, the ground connecting pins will align the module to facilitate the insertion of the conducting pins into the sockets 13 provided on the chassis.

Figure 4:
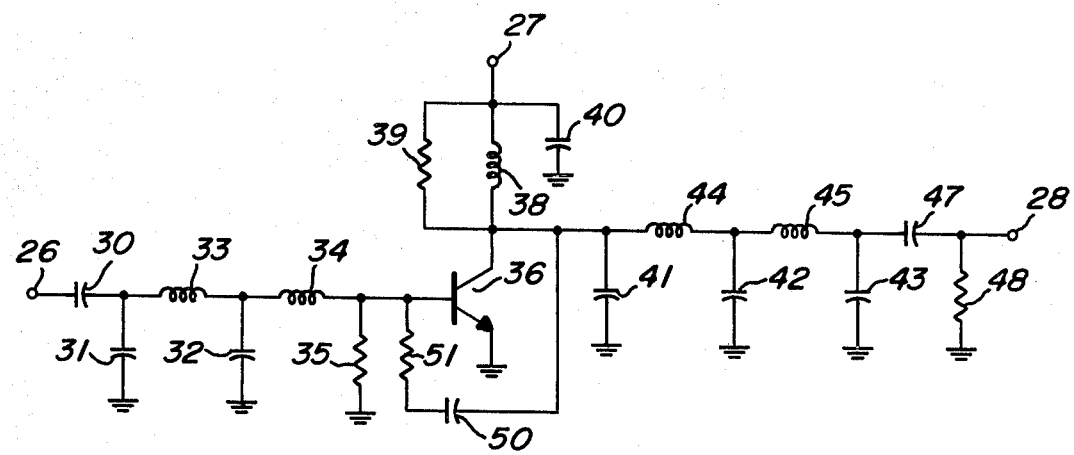
FIG. 4 is a circuit diagram illustrating the power amplifier unit.

FIG. 4 is a circuit diagram of a power amplifier circuit in accordance with the invention. It is to be pointed out, however, that the invention is not limited to the specific circuit configuration shown in FIG. 4, and the features of the invention can be used with other circuit configurations. The input signal from terminal 26 is applied through coupling capacitor 30 to an input tuned circuit including capacitors 31 and 32 and inductors 33 and 34. The output of this tuned circuit is developed across resistor 35 and is applied to the base electrode of transistor 36. The emitter electrode of transistor 36 is connected to ground, and the collector electrode is connected through choke coil 38 to the positive supply potential applied at terminal 27. It may be desired to connect a resistor 39 across the coil 38. The supply potential is bypassed by capacitor 40. The output of the transistor 36 is derived from the collector electrode and applied to an output tuned circuit including capacitors 41, 42 and 43 and inductors 44 and 45. Output coupling capacitor 47 applies amplified radio frequency signals to the output terminal 28. The resistor 48 may be connected between the output terminal 28 and ground. The amplifier has a feedback circuit connected from the collector of transistor 36 to the base thereof, and including capacitor 50 and resistor 51. The feedback circuit stabilizes the operation of the amplifier including transistor 36.

Referring now to FIG. 5, this shows the conductors 14 on the top surface of substrate 10, with the terminals 26, 27 and 28 for making connections to the circuit being shown along the bottom of the figure. The terminal 26 is connected to conductor 55 which is one of the conductors 14 provided on the top side of the substrate 10. The capacitor 30, which may be provided as a monolithic chip capacitor, is connected between the conductor 55 and conductor 56 which is another part of the coating 14 on the substrate 10. Connected between the conductor 56 and conductor 58 is another capacitor, which is the capacitor 31 of FIG. 4, and may also be a monolithic chip capacitor. The coating or conductor 58 provides a ground connection and this coating extends in a generally inverted U-shape in the center portion of the substrate 10. This conductor is connected by conductors extending through openings in the substrate with the coating 12 on the bottom side of the substrate, and which is electrically connected to the conducting housing 20. Accordingly, a very good ground connection is provided by conductor 58 to conductor 12 and the housing.

The inductor 33 of FIG. 4 is provided by a spiral shape conductive coating 60 which also forms one of the conductors 14 on the top side of the substrate 10. A flat conductive strip 65 forms a jumper connected from the conductor 56 to the center pad 61 of the spiral inductor 60, and extends over and is insulated from the portions 62 and 63 of the spiral inductor. This flat conducting strip 65 is soldered to the conductors 56 and 61. The spiral inductor 60 includes a loop portion 66 having a plurality of tuning strips 67 bridged thereacross. The tuning strips 67 can be open circuited, as by cutting the same by the use of a laser beam, to adjust the value of the spiral inductor 60. Such an operation can be performed after the components are assemblied on the substrate 10, as the laser beam cuts through the conductor without heating the substrate to disturb the solder connections to the conductors 14. The portions 66 and 67 of the inductor 60 form a microstrip tuned inductor.

The spiral inductor 60 is connected between the conductor 56 and conductor 68. Connected between the conductor 68 and the ground conductor 58 is the capacitor 32, which may also be a monolithic chip capacitor. Connected between the conductor 68 and conductor 70 is another inductor 72 formed by part of the conductors 14 on the top side of the substrate 10. This inductor 72 is of a configuration that various portions can be open-circuited to change the value of the inductance. The inductor 72 includes a portion 73 extending from the conductor 68 to a pair of bridges 74 and 75, which connect to portion 78 which is connected to the conductor 70. The conducting portion 73 extends beyond the bridges to join with connecting portion 76, which is connected to portion 77 to form a loop which connects with the conductor 70. The conducting portion 78 branches from the portion 77 and also connects with conductor 70. It will be apparent that by severing one or more of the bridges 74 and 75, the value of inductance of the inductor 72 can be changed. Connected between the conducting portion 77, which is adjacent to the conductor 70, and the ground conductor 58 is the resistor 35 across which the output of the input tuned circuit is developed.

Conductor 80, provided on the substrate 10 as a part of the top conductor 14 thereon, has a portion on which a transistor die 82 is adapted to be mounted. The die 82 has a collector electrode which is directly connected to the conductor 80. The base electrode of the die 82 is connected by conductors 84 to the conductor 70 to receive the output signal of the input tuned circuit. The emitter electrode of die 82 is connected by conductors 86 to portions of the ground conductor 58.

Connected to the conductor 80, which is connected to the collector of the transistor 82, is a chip inductor 88. This inductor forms the choke coil 38 shown in FIG. 4, and is connected between the conductor 80 and the conductor 90, which is connected to the terminal 27. The value of the inductor 80 is not critical so long as it exceeds a given minimum value. As previously stated, the terminal 27 provides the positive supply potential for the amplifier. This potential is applied through conductor 90 and inductor 88 to the conductor 80 which is connected to the collector of the transistor 82. A resistor 39 may also be connected between the conductors 80 and 90, but the use of this resistor may not be required. Connected between the conductor 90 and the ground conductor 58 is the capacitor 40, which may also be provided as a monolithic chip capacitor. Connected between the conductor 80 and the ground conductor 58 is capacitor 41, which may be a monolithic chip capacitor.

Connected between the conductor 80 and conductor 92 is an air wound coil 93. This includes a plurality of turns, as shown in FIG. 1, and has an axis which is horizontal when the unit is positioned as shown in FIG. 1. The coil 93 bridges a portion of the ground conductor 58. The conductor 92 is connected to conductor 94 by an S-shaped conductor 95, which has bridges 96 and 97 connected between adjacent conducting strips. It will be apparent that the bridge 96 or 97, or a portion of the loop bridged thereby, can be cut to change the inductance provided by the conductor 95. This inductance is in series with the coil 93, and coil 93 and conductor 95 together form the inductance 44 in the circuit of FIG. 4. It is therefore possible to change the value of the inductance 44 after the unit is assembled. Connected between the conductor 94 and ground conductor 58 is the capacitor 42, which may also be provided as a monolithic chip capacitor.

A larger coil 100 is connected between the conductor 94 and conductor 102. This coil is wound on an axis which extends vertically, as shown in FIG. 1, and this is at right angles to the axis of coil 93, so that interaction between the two coils is minimized. Connected between the conductor 102 and conductor 104 is an inductor section 105 which has a bridge 106 between adjacent conducting strips. It will be apparent that by cutting the bridge 106, or by cutting the loop which is bridged, the value of the inductance of section 105 can be changed. This inductance is in series with the coil 100 and together forms the inductance 45 shown in the circuit of FIG. 3. The value of this inductance can also be changed after the unit is assembled.

The conductor 104 is connected to the ground conductor 58 by capacitor 43, and is connected to the output conductor 108 by coupling capacitor 47. The capacitors 43 and 47 may be provided as monolithic chips. The resistor 48 of FIG. 3, if used, can be connected between the output conductor 108 and the ground conductor 58. The output terminal 28 for the unit is connected to the conductor 108.

The conductor 80, which is connected to the collector of the transistor 82, is connected by a jumper strap 110 to conductor 112. A monolithic chip capacitor 50 is connected between conductors 112 and 114. Connected between conductor 114 and the spiral inductor 72 is the resistor 51. Capacitor 50 and resistor 51 form the feedback circuit between the emitter of transistor 82 and the base thereof, as shown in FIG. 4. Resistor 51 is not directly connected to the conductor 70, which is connected to the base of the transistor, but to the conductor 76, which is part of inductor 72. In effect, a portion of the inductor 72 is connected in series with the resistor 51, but this is not significant in the operation of the circuit.

In assembling the components to the substrate, the transistor die 82 is first placed on the conductor 80. The die may be placed on a base which is gold flashed, and the conductor 80 may be gold plated, so that the die can be mounted thereon by the use of an eutectic cement. This operation requires the highest temperature utilized in the assembling operation. As a second step, the chip capacitors, air wound coils, chip inductor, resistors and bridges are soldered to the conductors 14 on the substrate by use of a lower temperature. These elements can all be soldered simultaneously. The third step is the mounting of the ceramic substrate to the base 18 of the housing 16 which forms the heat sink. This can be accomplished at a lower temperature so that it does not disturb the solder connections of the components or the connections of the transistor die.

After the substrate is mounted in the housing, the unit can be tested and tuned by cutting conductors, as previously described. The use of a laser beam to cut the conductors does not substantially heat the substrate, and the heat produced is localized and does not spread so that it affects the solder connections of the component. Since the unit can be tested and adjusted after being completely assembled, further testing and/or adjustment is not required when the unit is placed in the equipment. The radio frequency power amplifier may be used in a portable radio transmitter and it is merely necessary to plug in the module, with further tuning or adjustment not being required.

We claim:

1. A self-contained power amplifier module constructed as a plug-in hybrid microelectronic unit with integral heat sink including in combination:
    a flat ceramic substrate having a conducting coating on one side thereof and conductor means on the other side formed in a predetermined pattern to provide a plurality of conductor portions, and means connecting one portion of said conductor means to said conducting coating,
    terminal means connected to a plurality of portions of said conductor means for applying input signals thereto and deriving output signals therefrom,
    a semiconductor die having electrodes therewith secured to one portion of said conductor means, means connecting said electrodes to different portions of said conductor means,
    one of said conductor portions being shaped to form a flat faced inductor with severable tuning segments for controlling the inductance, and
    a conducting housing for said substrate having a portion for supporting said conducting coating and making direct electrical ground connection thereto, said housing serving as a heat sink by absorbing heat from said substrate by thermal conduction.

2. A power amplifier in accordance with claim 1 including an air coil connected between portions of said conductor means, with said air coil being connected to said conductor portion which is shaped to form an inductor.

3. A power amplifier in accordance with claim 1 including first and second air coils connected to said conductor portions, with said air coils having axes positioned at right angles to each other.

4. A power amplifier in accordance with claim 1 wherein said conductor portion which forms an inductor includes a plurality of tuning segments adapted to be severed to change the inductance value of said inductor.

5. A power amplifier in accordance with claim 1 further including a chip inductor connected between conducting portions on said substrate.

6. A power amplifier in accordance with claim 1 further including monolithic capacitor means connected between portions of said conductor means for providing capacitance between such portions.

7. A power amplifier in accordance with claim 5 further including resistor means connected between portions of said conductor means of said substrate.

8. A power amplifier in accordance with claim 1 including a bridge conductor connected from a first conductor portion to a second conductor portion and spaced from and insulated from a third conductor portion positioned on said substrate between said first and second conductor portions.

9. A power amplifier in accordance with claim 1 wherein said terminal means further includes a terminal connected to one of said conducting portions for applying operating potential thereto.

10. A power amplifier in accordance with claim 1 wherein said conducting housing includes a rectangular base having three side walls extending therefrom forming an enclosure for receiving said ceramic substrate, support means for said terminal means positioned on said base to form a fourth side wall of the enclosure, and a removable conducting top plate connected to said side walls for completing the enclosure for said substrate.

11. A power amplifier in accordance with claim 1 wherein said conducting housing includes a base for receiving said ceramic substrate, and portions extending from said base forming part of an enclosure for said ceramic substrate, and wherein said housing portions include recesses for receiving conductors for making ground connections to said conducting housing.

12. A power amplifier in accordance with claim 1 wherein said conducting housing includes a rectangular base for receiving said ceramic substrate, and three side walls extending from said base about said substrate, support means for said terminal means engaging said base and two of said side walls to form a fourth side wall about said substrate, said two side walls having recesses therein for receiving conducting posts, and wherein said terminal means is formed by conducting pins extending from said support means in a direction substantially parallel to said recesses in said side walls.

* * * * *